United States Patent
Lee et al.

(10) Patent No.: US 7,915,710 B2
(45) Date of Patent: Mar. 29, 2011

(54) METHOD OF FABRICATING A SEMICONDUCTOR DEVICE, AND SEMICONDUCTOR DEVICE WITH A CONDUCTIVE MEMBER EXTENDING THROUGH A SUBSTRATE AND CONNECTED TO A METAL PATTERN BONDED TO THE SUBSTRATE

(75) Inventors: Jong Ho Lee, Baebang-myeon Asan-si (KR); Dong Ho Lee, Seongnam-si (KR); Eun Chul Ahn, Yongin-si (KR); Yong Chai Kwon, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 128 days.

(21) Appl. No.: 12/222,004

(22) Filed: Jul. 31, 2008

(65) Prior Publication Data

US 2009/0032966 A1 Feb. 5, 2009

(30) Foreign Application Priority Data

Aug. 1, 2007 (KR) .................. 10-2007-0077507

(51) Int. Cl.
*H01L 23/538* (2006.01)

(52) U.S. Cl. .... 257/621; 257/686; 257/777; 257/E23.04

(58) Field of Classification Search ................ 257/621
See application file for complete search history.

(56) References Cited

U.S. PATENT DOCUMENTS

| 6,521,485 | B2 | 2/2003 | Su et al. | |
|---|---|---|---|---|
| 6,982,487 | B2 | 1/2006 | Kim et al. | |
| 7,193,297 | B2 | 3/2007 | Yamaguchi | |
| 7,214,615 | B2 | 5/2007 | Miyazawa | |
| 2004/0178484 | A1* | 9/2004 | Burdick et al. | 257/678 |
| 2004/0188822 | A1* | 9/2004 | Hara | 257/689 |
| 2007/0045868 | A1* | 3/2007 | Furuyama et al. | 257/778 |

FOREIGN PATENT DOCUMENTS

| JP | 2004-297045 | 10/2004 |
|---|---|---|
| JP | 2006-191126 | 7/2006 |
| KR | 10-2004-0083796 A | 10/2004 |
| KR | 10-2006-0111305 A | 10/2006 |

* cited by examiner

*Primary Examiner* — Stephen W Smoot
(74) *Attorney, Agent, or Firm* — Lee & Morse, P.C.

(57) ABSTRACT

A method of fabricating a semiconductor device includes providing a semiconductor substrate having an active surface, thinning the substrate by removing material from a second surface of the substrate opposite the active surface, bonding a metal carrier to the second surface of the thinned substrate, forming a via opening in the thinned substrate, forming a conductive member in the via opening, and patterning the metal carrier bonded to the second surface of the thinned substrate to form a metal pattern.

2 Claims, 10 Drawing Sheets

METHOD OF FABRICATING A SEMICONDUCTOR DEVICE, AND SEMICONDUCTOR DEVICE WITH A CONDUCTIVE MEMBER EXTENDING THROUGH A SUBSTRATE AND CONNECTED TO A METAL PATTERN BONDED TO THE SUBSTRATE

BACKGROUND OF THE INVENTION

1. Field of the Invention

Embodiments relate to a method of fabricating a three-dimensional (3-D) device and a device made thereby, e.g., a device in which one or more substrates are arranged in a stack.

2. Description of the Related Art

The development of next-generation electronic devices requires advances in packaging to enable the manufacture of reliable, compact, high performance devices. Further, cost-effective manufacturing of such devices depends on the ability to employ manufacturing processes that are robust and provide high yields. There are a wide variety of packages that have been developed. Existing packages, however, may not fulfill all of the above-described requirements for next-generation devices.

SUMMARY OF THE INVENTION

Embodiments are therefore directed to a method of fabricating a 3-D device and a device made thereby, which substantially overcome one or more of the problems due to the limitations and disadvantages of the related art.

It is therefore a feature of an embodiment to provide a method of fabricating a 3-D device and a device made thereby in which a metal pattern is formed on a surface of a semiconductor substrate that is opposite to an active surface.

It is therefore another feature of an embodiment to provide a method of fabricating a 3-D device and a device made thereby in which a redistribution pattern is formed for coupling to a next-level substrate.

At least one of the above and other features and advantages may be realized by providing a method of fabricating a semiconductor device, the method including providing a semiconductor substrate having an active surface, thinning the substrate by removing material from a second surface of the substrate opposite the active surface, bonding a metal carrier to the second surface of the thinned substrate, forming a via opening in the thinned substrate, forming a conductive member in the via opening, and patterning the metal carrier bonded to the second surface of the thinned substrate to form a metal pattern.

The metal pattern may include a redistribution pattern. An electrically insulating adhesive layer may be used to bond the metal carrier to the second surface of the thinned substrate. The metal pattern may include an electrically isolated heat sink. The semiconductor substrate may be a wafer, and the method may further include dicing the wafer after patterning the metal carrier.

The via opening may be formed in a location corresponding to a conductive pad on the active surface of the thinned substrate, the conductive member may extend from the conductive pad to the second surface of the substrate, the metal carrier may be bonded to the second surface of the thinned substrate before forming the via opening, and forming the via opening may include etching the thinned semiconductor substrate using the metal carrier as an etch stop at the bottom of the via opening.

The via opening may be formed to penetrate the substrate and expose a portion of the metal carrier, the conductive member in the via opening may be formed using a plating operation using the metal carrier as a seed layer. The method may further include attaching a second substrate to the second surface of the thinned semiconductor substrate to form a stack. The second substrate may include a plurality of conductive features bonded to corresponding features of the metal pattern. The second substrate may have an active surface facing the semiconductor substrate, and the metal pattern may include at least one of a power line and a ground line electrically connected to a conductive feature on the active surface of the second substrate. The metal pattern may include a redistribution pattern, and an active surface of the second substrate may face the redistribution pattern. The method may further include attaching a third substrate to the active surface of the thinned semiconductor substrate.

At least one of the above and other features and advantages may also be realized by providing a semiconductor device, including a semiconductor substrate having an active surface, a conductive member in a via extending through the substrate, a metal pattern bonded to a second surface of the substrate opposite the active surface and connected directly to the conductive member, and an electrically insulating adhesive layer between the metal pattern and the second surface of the substrate, the adhesive layer bonding the metal pattern to the substrate.

The metal pattern may include a redistribution pattern. The metal pattern may include an electrically isolated heat sink. The conductive member may electrically connect the active surface to the metal pattern. The device may further include a second substrate attached to the second surface of the substrate in a stack. The second substrate may include a plurality of conductive features bonded to corresponding features of the metal pattern. The second substrate may have an active surface facing the semiconductor substrate, and the metal pattern may include at least one of a power line and a ground line electrically connected to a conductive feature on the active surface of the second substrate.

The metal pattern may include a redistribution pattern, and an active surface of the second substrate may face the redistribution pattern. The second substrate may be a printed circuit board. The device may further include a third substrate attached to the active surface of the semiconductor substrate.

The third substrate may include an active surface and a second surface opposite the active surface, a second metal pattern may be bonded to the second surface of the third substrate, the second metal pattern being disposed between the first substrate and the third substrate, and the second metal pattern may provide at least one electrical connection between the active surface of the third substrate and the active surface of the first substrate. The third substrate may include an active surface and a second surface opposite the active surface, a second metal pattern may be bonded to the second surface of the third substrate, the third substrate being disposed between the second metal pattern and the first substrate, and the active surface of the third substrate may face and may be electrically connected to the active surface of the first substrate. The second substrate may be a printed circuit board, and the device may further include a second printed circuit board stacked on and electrically connected to the third substrate, such that the first and third substrates are between the second substrate and the second printed circuit board.

At least one of the above and other features and advantages may also be realized by providing an electronic system, including a processor coupled to a memory component that includes a semiconductor substrate, a metal pattern, and a second substrate. The semiconductor substrate may have an active surface, a conductive member may be in a via extending through the semiconductor substrate, the metal pattern may be bonded to a second surface of the semiconductor substrate opposite the active surface and may be connected directly to the conductive member, an electrically insulating adhesive layer may be disposed between the metal pattern and the second surface of the semiconductor substrate, the adhesive layer bonding the metal pattern to the semiconductor substrate, and the second substrate may be bonded to the metal pattern.

At least one of the above and other features and advantages may also be realized by providing a method of fabricating an electronic system, including providing a semiconductor memory substrate having an active surface, thinning the semiconductor memory substrate by removing material from a second surface of the semiconductor memory substrate opposite the active surface, bonding a metal carrier to the second surface of the thinned semiconductor memory substrate, forming a via opening in the thinned semiconductor memory substrate, forming a conductive member in the via opening, patterning the metal carrier bonded to the second surface of the thinned semiconductor memory substrate to form a metal pattern, and coupling a processor substrate to the thinned semiconductor memory substrate having the metal pattern bonded thereto.

BRIEF DESCRIPTION OF THE DRAWINGS

The above and other features and advantages will become more apparent to those of ordinary skill in the art by describing in detail example embodiments thereof with reference to the attached drawings, in which.

DETAILED DESCRIPTION OF THE INVENTION

Korean Patent Application No. 10-2007-0077507, filed on Aug. 1, 2007, in the Korean Intellectual Property Office, and entitled: "Semiconductor Package, Wafer Stack Package Using the Same, and Method for Manufacturing the Same," is incorporated by reference herein in its entirety.

Embodiments will now be described more fully hereinafter with reference to the accompanying drawings; however, they should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Where an element is described as being connected to a second element, the element may be directly connected to second element, or may be indirectly connected to second element via one or more other elements. Further, where an element is described as being connected to a second element, it will be understood that the elements may be electrically connected, e.g., in the case of transistors, capacitors, power supplies, nodes, etc. In the figures, the dimensions of regions may be exaggerated and elements may be omitted for clarity of illustration. Like reference numerals refer to like elements throughout.

Figure 1A:
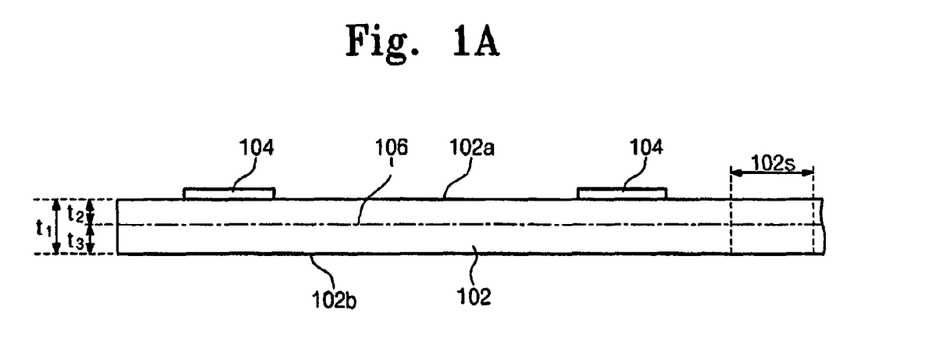
FIGS. 1A through 1E illustrate cross-sectional views of stages in a method of fabricating a chip package according to a first embodiment.

FIGS. 1A through 1E illustrate cross-sectional views of stages in a method of fabricating a chip package, e.g., a wafer level package, for a 3-D device package according to a first embodiment. Referring to FIG. 1A, a wafer 102 having a thickness $t_1$ may be prepared. The wafer 102 may include, e.g., conductive pads 104 for providing connections, e.g., signals, power, ground, etc., to devices formed on an active surface 102a of the wafer 102. The devices may include transistors, resistors, capacitors, etc. The wafer 102 may be, e.g., a semiconductor wafer, an opto-electronic wafer having optical and electronic devices thereon, etc. The wafer 102 may include a plurality of device patterns replicated thereon and corresponding to individual dies. The wafer 102 may be designed with scribe lanes 102s, i.e., dicing lanes, to facilitate separation of the wafer 102 into individual dies.

The wafer 102 may be processed to remove a predetermined portion of its thickness from a rear surface 102b thereof, i.e., from the surface opposite the active surface 102a. Such a thinning process may remove a predetermined thickness $t_3$ of the initial thickness $t_1$ so as to leave a thinned wafer 103 having a remaining thickness $t_2$ ($t_1=t_2+t_3$).

Figure 1B:
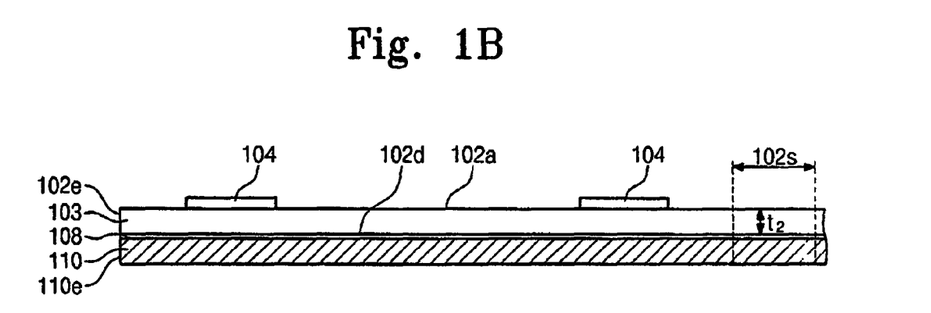

Referring to FIG. 1B, a metal carrier 110, e.g., a carrier including one or more metals such as aluminum, copper, nickel, platinum, silver, gold, etc., may be laminated to a rear surface 102d of the thinned wafer 103. The carrier 110 may be bonded directly to the rear surface 102d using, e.g., an adhesive layer 108. The adhesive layer 108 may include, e.g., a liquid or film-type epoxy, a silicon-based material, etc. The silicon-based material may include, e.g., silicon acetate, water-soluble silicon, or acetic acid free silicon resin.

The carrier 110 may enhance the strength, e.g., stiffness, etc., of the thinned wafer 103. Additionally, the carrier 110 may be patterned in subsequent operations to form conductive features on the backside of the thinned wafer 103. The example embodiment shown in FIG. 1B includes a carrier 110 having a thickness that is about equal to the thickness $t_2$ of the thinned wafer 103, although it will be appreciated that the thickness of the carrier 110 may be greater than, less than, or equal to that of the thinned wafer 103.

Figure 1C:
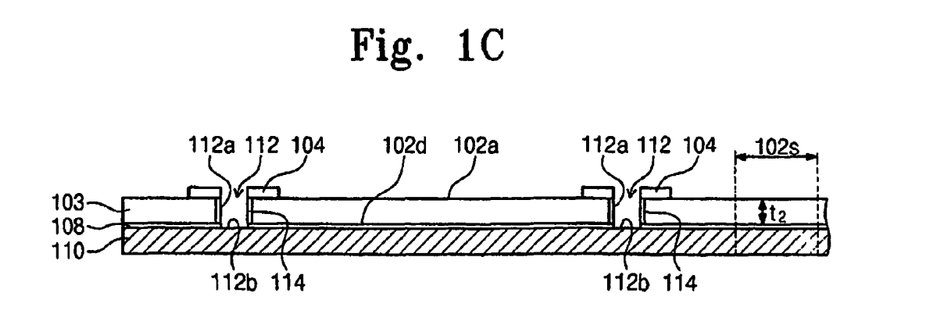

Referring to FIG. 1C, via openings 112 may be formed in the thinned wafer 103 using, e.g., photolithography and etching such as reactive ion etching, sputter etching, plasma etching (dry etching), etc., or using, e.g., laser drilling, in locations corresponding to one or more of the pads 104. In an implementation, the via openings 112 may be formed to penetrate the pad 104 as well as the thinned wafer 103 thereunder, using the carrier 110 as an etch stop. Sidewalls of the via openings 112 may be vertical or sloped.

As described below, the via openings 112 may be filled with a conductive material and used to electrically connect the pads 104 to the carrier 110, which may be subsequently patterned to form a conductive pattern. In order to electrically insulate the conductive material in the via openings from the thinned wafer 103, a dielectric layer 114 may be formed on sidewalls 112a of the via openings 112. The dielectric layer 114 may be formed using, e.g., thermal oxidation, which may be combined with a wet or dry etch operation to remove any oxide formed at the bottom 112b of the via openings 112 on the carrier 110.

Figure 1D:
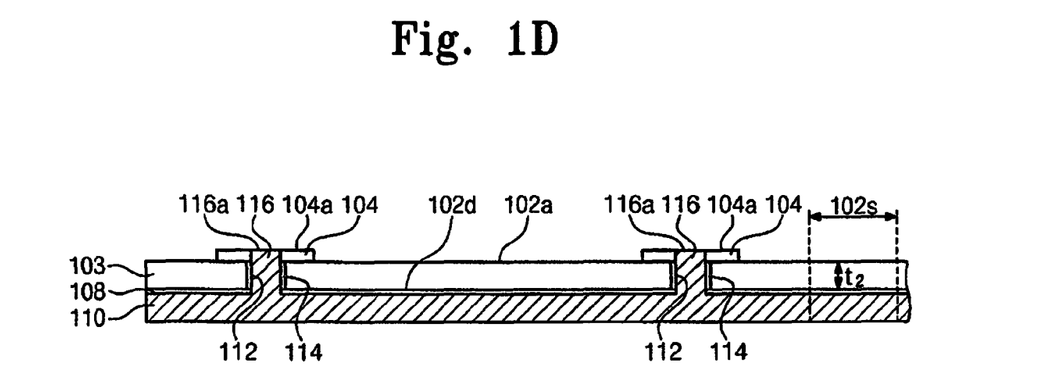

Referring to FIG. 1D, the conductive material filled in the via openings 112 may form conductive members 116 that electrically couple the pads 104 to the respective underlying portions of the carrier 110. The via openings 112 may be filled with the conductive material using, e.g., a deposition process such as chemical vapor deposition (CVD) or atomic layer deposition (ALD), a physical vapor deposition (PVD) process such as sputtering, a plating process, etc. The material used to form the conductive members 116 may be the same as, or different from, the material that forms the carrier 110.

When a deposition process is used to form the conductive members 116, additional processes such as patterning, chemical mechanical polishing (CMP), etching, etc., may be used to remove conductive material deposited on the pads 104 and/or active surface 102a of the thinned wafer 103. When a plating process is used to form the conductive members 116, a seed layer may be first formed in the via openings 112 to enable selective plating of the conductive material in the via openings 112. In another implementation, the carrier 110 itself may be used as a seed layer.

Figure 1E:
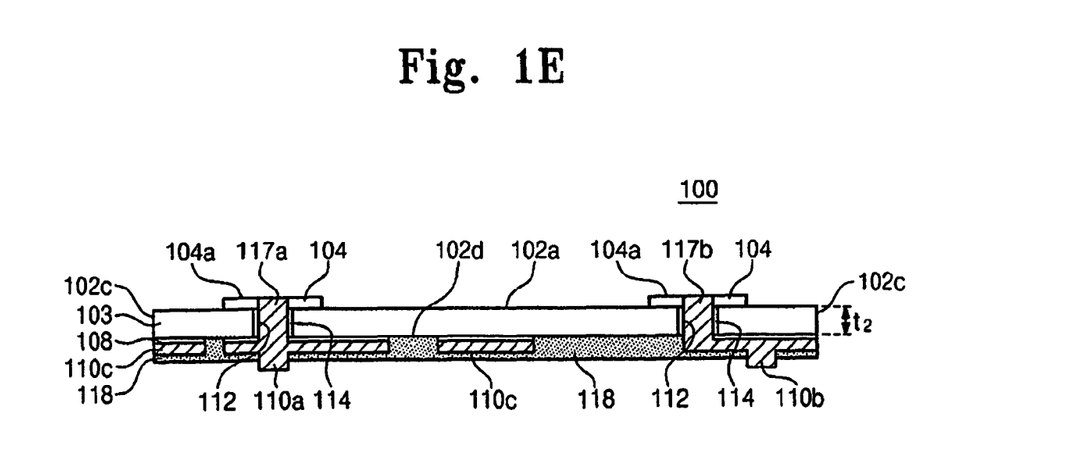

Referring to FIG. 1E, the carrier 110 may be patterned to form conductive features. For example, the carrier 110 may be patterned to form conductive features 110a, 110b and 110c shown in FIG. 1E. One or more patterning operations may be used to form features of different thicknesses, e.g., wherein features 110c are recessed relative to features 110a and 110b. Patterning the carrier 110 may include, e.g., masking and wet etching operations. In an implementation, one or more through-hole electrodes 117a, 117b shown in FIG. 1E, may include members that extend laterally along the thinned wafer 103. Such lateral extensions may be used for, e.g., power lines, ground planes, etc. In another implementation, one or more through-hole electrodes 117a, 117b may be straight through-hole electrodes without lateral extensions.

The thinned wafer 103 may be diced, e.g., by sawing, along the scribe lanes 102s to form individual dies. In an implementation, the dicing operation may also be used to separate one or more of the conductive features 110a, 110b and 110c at side surfaces 102c of the chip package 100. The conductive members 116 may, in combination with corresponding patterned carrier portions 110a and 110b, form the through-hole electrodes 117a and 117b, which may be used for, e.g., connections to other dies or substrates.

A protection layer 118 may be formed to cover the conductive features 110a, 110b and 110c. The protection layer 118 may be selectively formed on the back surface of the die, and may expose the features 110a and 110b, which may serve as connection pads. The protection layer 118 may include an electrically insulating material such as a photoresist, a photosensitive solder resist, epoxy molding compound, an oxide layer, a nitride layer, etc. The protection layer 118 may electrically isolate non-exposed portions of the patterned carrier, e.g., the conductive feature 110c, etc., from conductive features disposed on an adjacent die or other substrate in a 3-D device, as described below (not shown in FIG. 1E).

As described above, the method of fabricating a 3-D device according to the first embodiment may provide a number of advantages. For example, the aspect ratio of the via opening 112, i.e., the height of the via opening 112 as compared to the width thereof, may be relatively low as compared to a via opening formed through an unthinned substrate or a via opening formed through two or more stacked dies. Accordingly, formation of the via opening 112 may be relatively simple and may be performed with a high level of accuracy. Further, the method according to the first embodiment may enable the carrier 110 to serve as an etch stop layer and/or seed layer during fabrication, and may allow the carrier 110 to be patterned to form various features such as redistribution patterns, connection pads, power lines, ground planes, etc., in a simple manner. Additionally, the likelihood of voids occurring in the conductive material that forms the conductive members 116 may be reduced due to the relatively low aspect ratios of the via openings 112. Accordingly, yields and reliability of the chip package 100 may be improved.

The chip package 100 fabricated as described above may be configured to connect directly to an adjacent chip package. Thus, two or more chip packages 100 may be stacked in a 3-D structure. Further, such a structure may be formed without the need to form very deep, high aspect ratio through silicon vias (TSV's) penetrating through each of the dies in the structure, and fabrication of a 3-D structure may therefore be simplified. For example, since the chip package 100 is formed from the thinned wafer 103, it may be easier to control the sidewall profile of the via openings 112, the formation of the via openings 112 may not have to penetrate as many layers, and the process for filling the via openings 112 may be made faster and may result in fewer voids as compared to a 3-D structure formed using conventional TSV's.

In an implementation, the carrier 110 may be patterned to form a redistribution pattern for attachment to an adjacent substrate, e.g., a printed circuit board, having a feature pitch greater or less than that of the chip package 100, thus enabling the formation of redistribution patterns on the top and/or bottom of the chip package 100. Further, the carrier 110 may be patterned to form power lines, ground planes and/or heat sinks, which may be disposed between adjacent chip packages 100 when the adjacent chip packages 100 are vertically stacked. Moreover, since the carrier 110 may be disposed opposite the active surface of the chip package 100, both sides of the chip package 100 may be used, thereby increasing the degree of integration of the resultant device. The stacked device may be implemented as, e.g., a processor coupled to a memory. The processor may be, e.g., a microprocessor, a graphics processor, a processor implementing one or more levels or protocols of a communications stack, a processor implementing a codec such as an audio or video codec, etc.

Figure 2A:
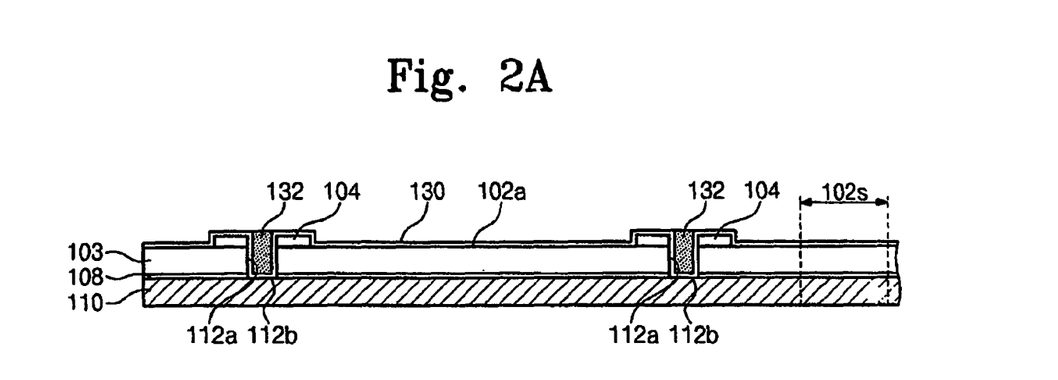
FIGS. 2A through 2C illustrate cross-sectional views of stages in a method of fabricating a chip package according to a second embodiment.
Figure 2B:
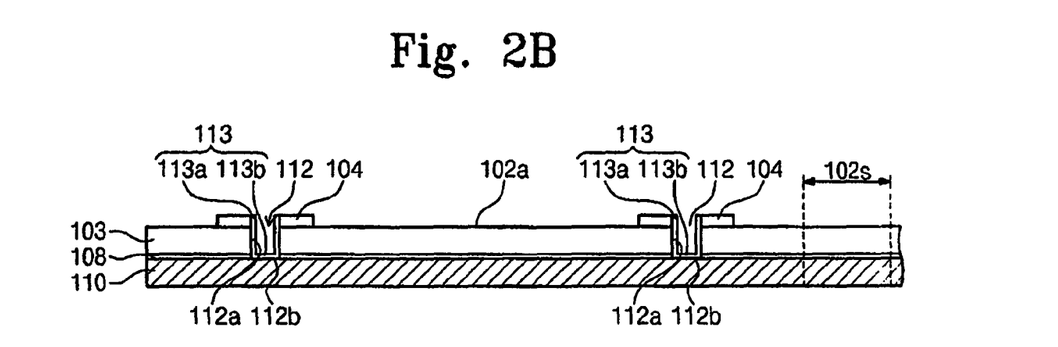
Figure 2C:
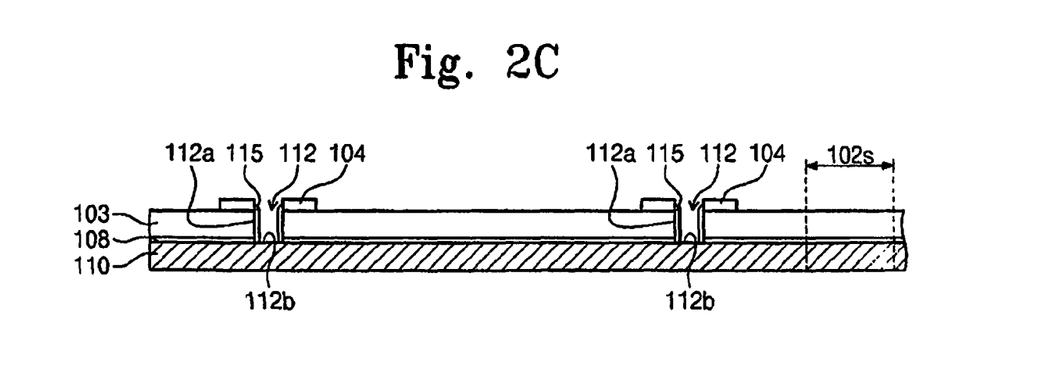

Advantages such as those set forth above may also be provided by additional embodiments, which will now be described. FIGS. 2A through 2C illustrate cross-sectional views of stages in a method of fabricating a chip package according to a second embodiment. In the description of the second embodiment and the embodiments that follow, the description of features that are the same as those in the first embodiment may be omitted in order to avoid repetition.

Referring to FIG. 2A, the thinned wafer 103 illustrated in FIG. 1B may be processed to form the via openings 112 as described above. Subsequently, a dielectric layer 130 may be formed on the thinned wafer 103 and in the via openings 112. The dielectric layer 130 may be formed as a conformal layer, i.e., a layer having a substantially uniform thickness that follows the orientation of features on the underlying surface. Processes usable for the formation of the dielectric layer 130 may include CVD, PVD, etc., which may be selected based on the particular feature sizes and materials being implemented.

After formation of the conformal dielectric layer 130, a mask layer 132 may be formed in the via openings 112. The mask layer 132 may completely fill the via openings 112 and may be formed of, e.g., a photoresist film. The mask layer 132 may be used to protect the dielectric layer 130 in the via openings 112. The material used for the dielectric layer 130 may have an etch selectivity with respect to the thinned wafer 103. Accordingly, using the mask layer 132 as an etch mask, the dielectric layer 130 may be selectively removed from the thinned wafer 103. In an implementation, the dielectric layer 130 may be removed from all of the thinned wafer 103 except in the via openings 112, thus forming a dielectric pattern 113, as shown in FIG. 2B. The dielectric pattern 113 may include sidewall portions 113a on the sidewalls 112a of the via openings 112, as well as bottom portions 113b on the carrier 110 at the bottoms 112b of the via openings 112. The mask layer 132 may then be removed.

Referring to FIG. 2C, the dielectric pattern 113 may be etched to remove the bottom dielectric portions 113b, thereby exposing the carrier 110 at the bottoms 112b of the via openings 112. The etching process may also partially remove upper regions of the sidewall portions 113a, yielding dielectric sidewall spacers 115. The via openings 112 may then be filled with a conductive material in the manner described above in connection with the first embodiment, and the dielectric sidewall spacers 115 may electrically insulate the resultant conductive features from the surrounding thinned wafer 103. Subsequent processing may then be carried out as for the other embodiments described herein.

Figure 3:
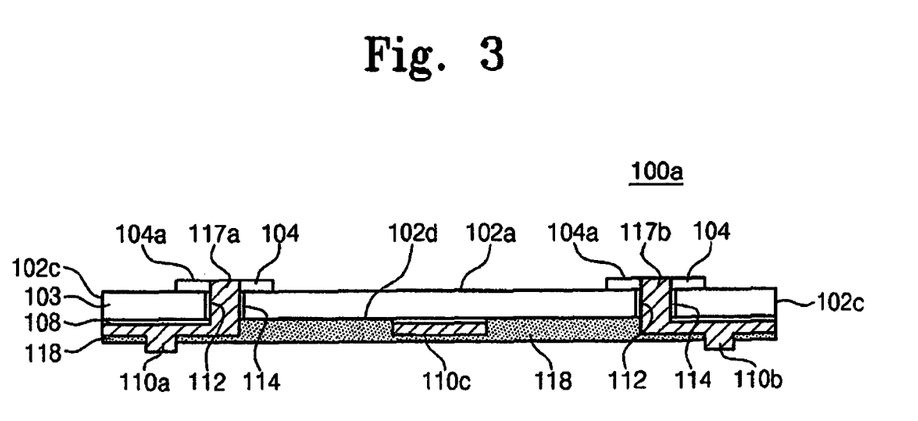
FIG. 3 illustrates a chip package according to a third embodiment.

FIG. 3 illustrates a chip package 100a according to a third embodiment. Referring to FIG. 3, each of the connection pads 110a and 110b may extend laterally away from the respective through-hole electrodes 117a and 117b so as to redistribute the pad connections. Thus, a pitch of the connection pads 110a, 110b may be enlarged relative to the pitch of the corresponding connections to the thinned wafer 103. In an implementation, a heat sink 110c may also be formed in, e.g., a central region of the thinned wafer 103, by patterning the carrier 110.

Figure 4:
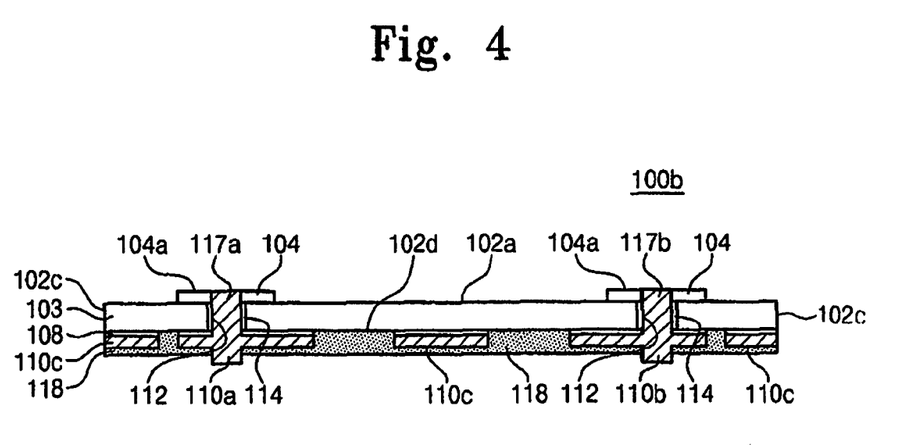
FIG. 4 illustrates a chip package according to a fourth embodiment.

FIG. 4 illustrates a chip package 100b according to a fourth embodiment. Referring to FIG. 4, each of the connection pads 110a and 110b may be arranged directly below the corresponding through-hole electrodes 117a and 117b. The connection pads 110a and 110b may be used to couple to corresponding pads on an adjacent chip package, as described below. In an implementation, one or more heat sinks 110c may also be formed, e.g., in central and peripheral regions of the thinned wafer 103, by patterning the carrier 110.

Figure 5A:
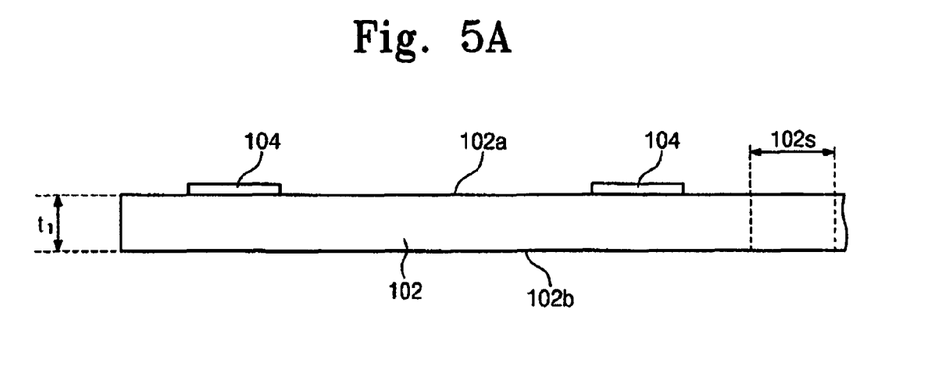
FIGS. 5A through 5C illustrate cross-sectional views of stages in a method of fabricating a chip package according to a fifth embodiment.
Figure 5B:
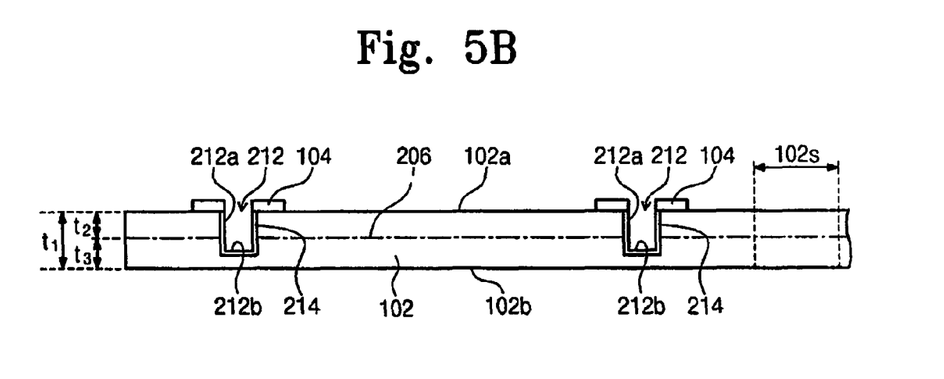
Figure 5C:
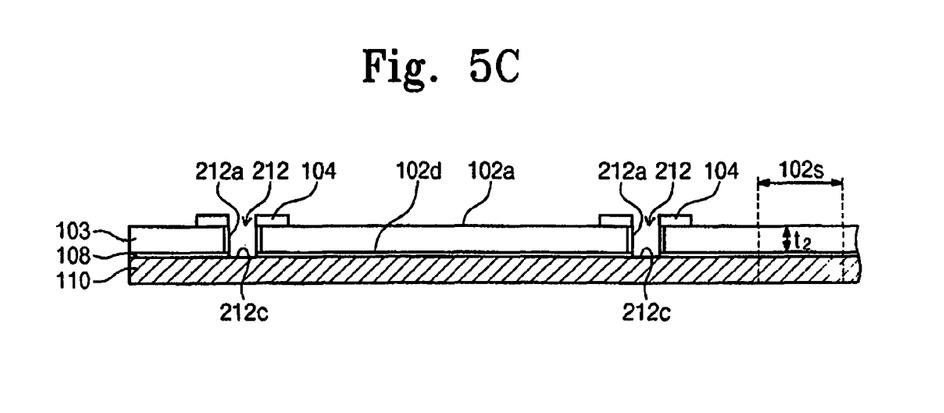

FIGS. 5A through 5C illustrate cross-sectional views of stages in a method of fabricating a chip package according to a fifth embodiment, in which formation of via openings 212 includes operations that are performed before wafer thinning. Referring to FIG. 5A, the wafer 102 may be provided, and may have a thickness $t_1$. The conductive pads 104 may be formed on the upper surface 102a of the wafer 102. Devices, e.g., transistors, etc., may be formed on the upper surface 102a, which may be the active surface. The lower surface 102b may be bulk substrate, i.e., it may not have devices formed thereon. The scribe lane 102s may be provided to define individual dies.

Referring to FIG. 5B, via openings 212 may be formed in the wafer 102 having the thickness $t_1$, i.e., before the wafer 102 is thinned. In an implementation, the via openings 212 may be blind openings, i.e., they may not penetrate through the lower surface of the wafer 103, and may be positioned corresponding to the pads 104. Sidewalls 212a and the bottoms 212b of the via openings 212 may be lined with a dielectric layer 214. The dielectric layer 214 may be, e.g., an oxide layer, which may be formed using a thermal oxidation process, a deposition process, etc., in the same manner as described above in connection with the first embodiment.

The wafer 102 may be thinned to the thickness $t_2$ by removing the thickness $t_3$ from the backside of the wafer 102, i.e., by removing material from the non-active surface 102b. Thinning may yield the thinned wafer 103, and the via openings 212 may expose the carrier 110 at the bottoms 212c of the via openings 212 (refer to FIG. 5C). Thus, thinning may remove the wafer material at bottoms 212b of the via openings 212 so that the vias 212 penetrate through the thinned wafer 103. After the thinning operation, the dielectric layer 214 may remain on the sidewalls 212a of the via openings 212.

Referring to FIG. 5C, the thinned wafer 103 may be combined with the carrier 110. The carrier 110 may be bonded to a non-active surface 102d of the thinned wafer 103 using the insulating adhesive layer 108. Thus, a structure similar to that described above in connection with FIG. 1C may be produced. Subsequent processing may then be carried out as described in connection with the other embodiments described herein.

Figure 6A:
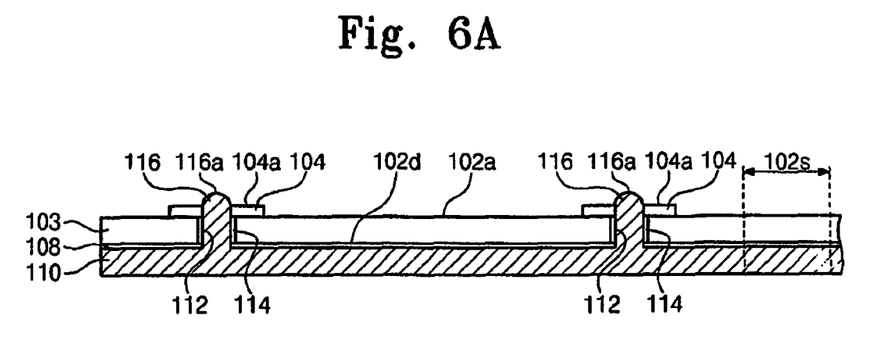
FIGS. 6A and 6B illustrate cross-sectional views of stages in a method of fabricating a chip package according to a sixth embodiment.
Figure 6B:
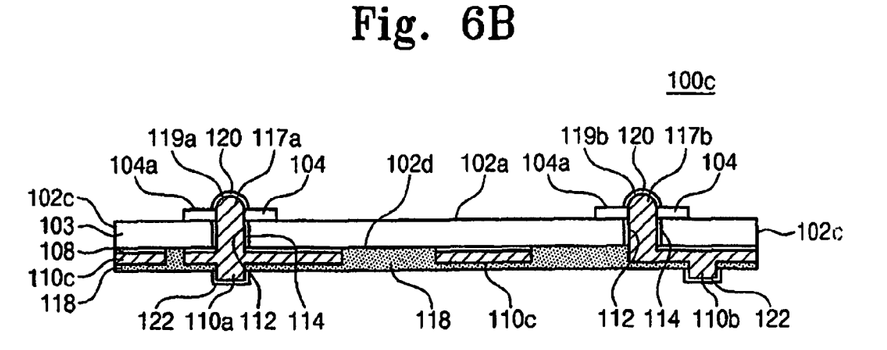

FIGS. 6A and 6B illustrate cross-sectional views of stages in a method of fabricating a chip package 100c according to a sixth embodiment. Referring to FIG. 6A, the thinned wafer 103 may have the carrier 110 laminated thereto and the dielectric layer 114 disposed in the via openings 112, as described above in connection with the first embodiment. The via openings 112 may be filled with a conductive material, e.g., using a plating or deposition operation, such that the conductive material grows to project above the adjacent top surface 104a of the pad 104. The resulting conductive member 116 may have an upper surface 116a that protrudes with a generally hemispherical shape. The protrusion of the conductive member 116 may simplify electrical connections with an adjacent chip package or substrate.

Referring to FIG. 6B, the carrier 110 may be patterned, e.g., in the manner described above in connection with the first through fourth embodiments. Protruding portions of the patterned carrier, e.g., exposed connection pads 110a and 110b, and/or protruding portions 119a, 119b of the through-hole electrodes 117a, 117b, may be coated. In an implementation, the protruding portions 119a, 119b may be coated with a first film 120, and the exposed connection pads 110a, 110b may be coated with a second film 122. The films 120, 122 may include, e.g., lead, gold or nickel, and may be formed by, e.g., plating. Thus, connections may be made to the protruding features in a manner similar to solder balls or solder bumps.

Figure 7:
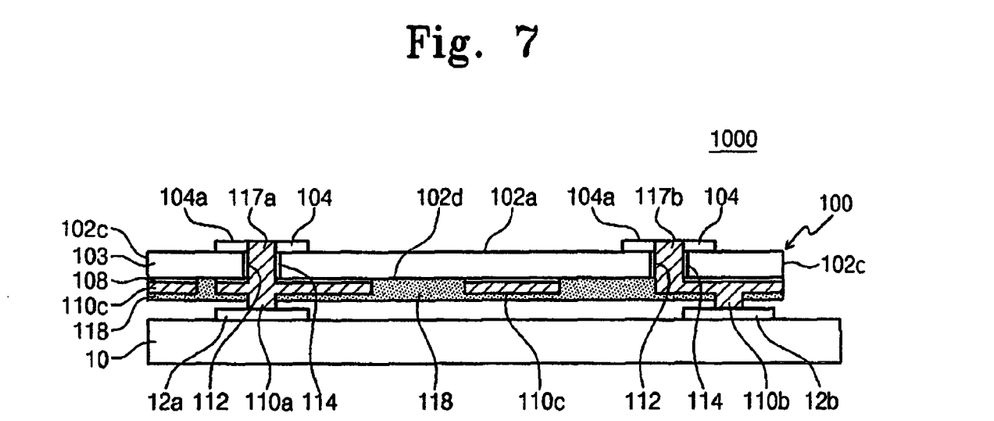
FIG. 7 illustrates a cross-sectional view of a 3-D device package according to a seventh embodiment.

The methods and structures described above may be employed to fabricate a variety of 3-D devices, example embodiments of which will now be described. FIG. 7 illustrates a cross-sectional view of a 3-D device package 1000 according to a seventh embodiment. Referring to FIG. 7, the device 1000 may include a die, e.g., the chip package 100 described above, stacked on and attached to a next-level substrate 10. The next-level substrate 10 may be the same size as the chip package 100, or may be a different size. The next-level substrate 10 may be, e.g., another chip package, a die, an interposer, a printed circuit board, a patterned wafer, etc. The next-level substrate 10 may be another chip package 100.

The chip package 100 may be attached to the next-level substrate 10, and pads 110a, 110b of the chip package 100 may be electrically coupled to the next-level substrate 10 via respective pads 12a, 12b thereon. In an implementation, the chip package 100 may include redistribution wiring, e.g., the carrier 110 may be patterned to form the redistributed pad 110b that is offset from the corresponding through-hole electrode 117b. Physical and/or electrical connections between the chip package 100 and the next-level substrate 10 may be made using, e.g., solder balls, solder bumps, etc., disposed at the interfaces of the connection pads 110a and 110b with respective pads 12a and 12b.

Figure 8:
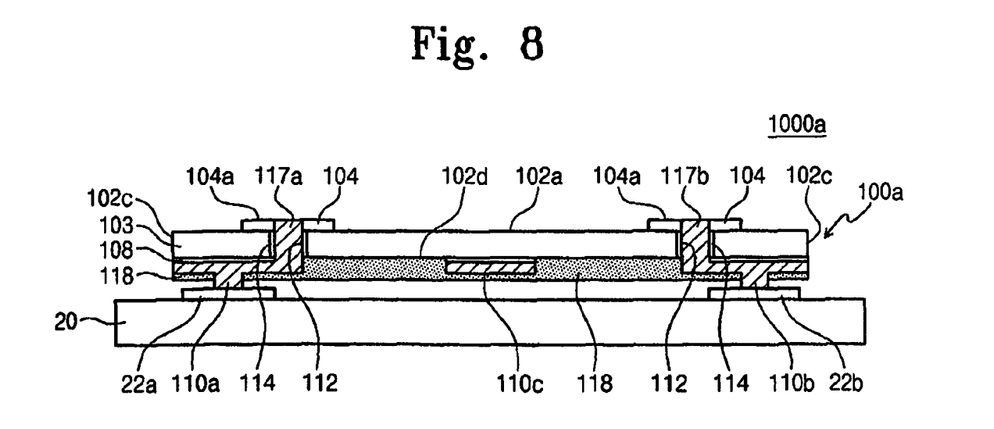
FIG. 8 illustrates a cross-sectional view of a 3-D device package according to an eighth embodiment.

FIG. 8 illustrates a cross-sectional view of a 3-D device package 1000a according to an eighth embodiment. Referring to FIG. 8, the device 1000a may include the chip package 100a stacked on and attached to a next-level substrate 20. The next-level substrate 20 may have pads 22a and 22b corresponding to the connections pads 110a and 110b, respectively. Each of the connection pads 110a, 110b may be redistributed with respect to the corresponding through-hole electrodes 117a and 117b. Physical and/or electrical connections between the chip package 100a and the next-level substrate 20 may be made using, e.g., solder balls, solder bumps, etc., disposed at the interfaces of the connection pads 110a and 110b with respective pads 22a and 22b.

Figure 9:
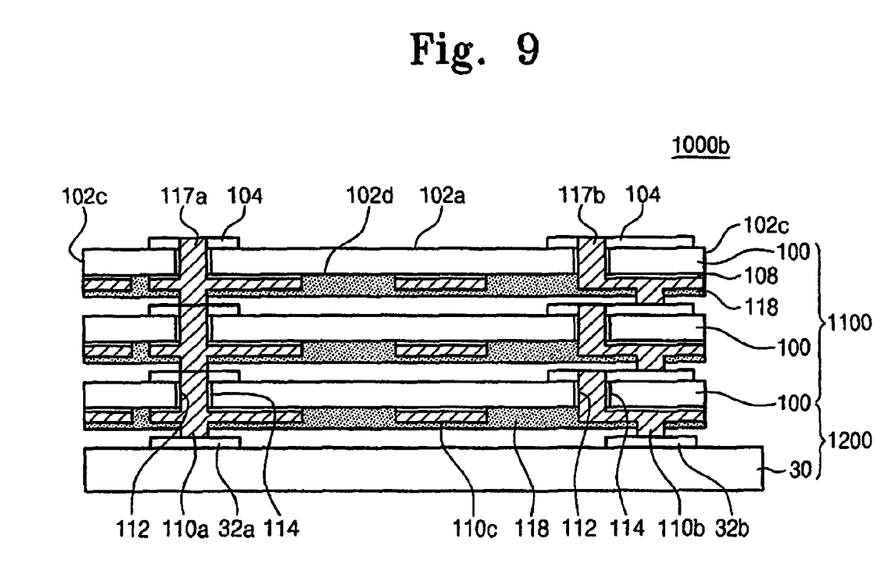
FIG. 9 illustrates a cross-sectional view of a 3-D device package according to a ninth embodiment.

FIG. 9 illustrates a cross-sectional view of a 3-D device package 1000b according to a ninth embodiment. Referring to FIG. 9, the device 1000b may include a plurality of dies, which may be stacked on and attached to a next-level substrate 30. For example, three chip packages 100 may be assembled in a stack on the next-level substrate 30. In an implementation, each of the chip package 100 may be the same size, and the next-level substrate 30 may be a different size, e.g., it may be larger.

As illustrated in FIG. 9, same-substrate stacking structure 1100 may be combined with different-substrate stacking structure 1200 in a single 3-D device. In the same-substrate stacking structure 1100, the size of the chip pad 104 connected to the redistributed pad 110b may be made larger than that of the chip pad 104 connected to the connection pad 110a, which may simplify layout of the connections between adjacent chip packages 100. In the different-substrate stacking structure 1200, the through-hole electrode 117a may be connected to a corresponding pad 32a via the connection pad 110a. Similarly, the through-hole electrode 117b may be electrically connected to a corresponding pad 32b of the next-level substrate 30 via the redistributed connection pad 110b.

Figure 10:
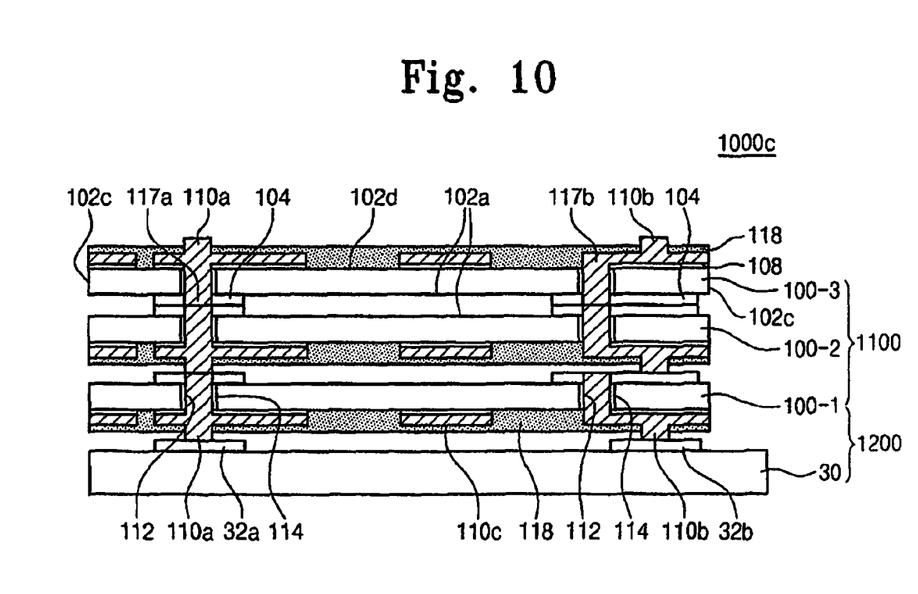
FIG. 10 illustrates a cross-sectional view of a 3-D device package according to a tenth embodiment.

FIG. 10 illustrates a cross-sectional view of a 3-D device package 1000c according to a tenth embodiment. Referring to FIG. 10, the device 1000c may include three chip packages 100, i.e., dies 100-1, 100-2 and 100-3, stacked on and attached to the next-level substrate 30. The upper two dies 100-3 and 100-2 may be attached to one another in a front-to-front orientation, i.e., the die 100-3 may be inverted so that the surface 102a thereof faces the surface 102a of the die 100-2. The lower two dies 100-2 and 100-1 may be attached to one another in a front-to-back orientation.

Figure 11:
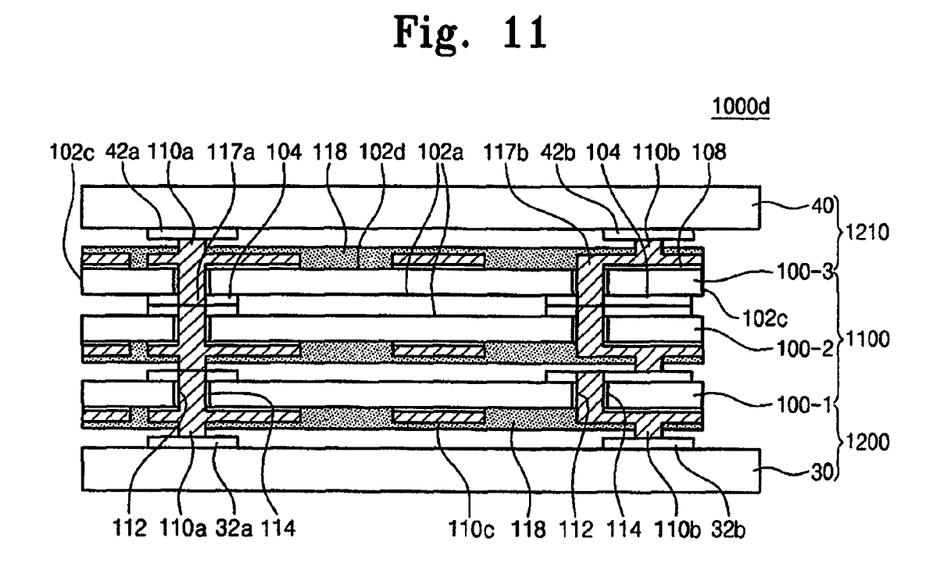
FIG. 11 illustrates a cross-sectional view of a 3-D device package according to an eleventh embodiment.

FIG. 11 illustrates a cross-sectional view of a 3-D device package 1000d according to an eleventh embodiment. Referring to FIG. 11, the device 1000d may include three chip packages 100, i.e., dies 100-1, 100-2 and 100-3, stacked on and attached to the next-level substrate 30, and a second next-level substrate 40 may be stacked on the uppermost die 100-3, such that the three chip packages 100 are between the next-level substrates 30 and 40. The upper two dies 100-3 and 100-2 may be attached to one another in a front-to-front orientation, i.e., the die 100-3 may be inverted so that the surface 102a thereof faces the surface 102a of the die 100-2. The lower two dies 100-2 and 100-1 may be attached to one another in a front-to-back orientation.

Figure 12:
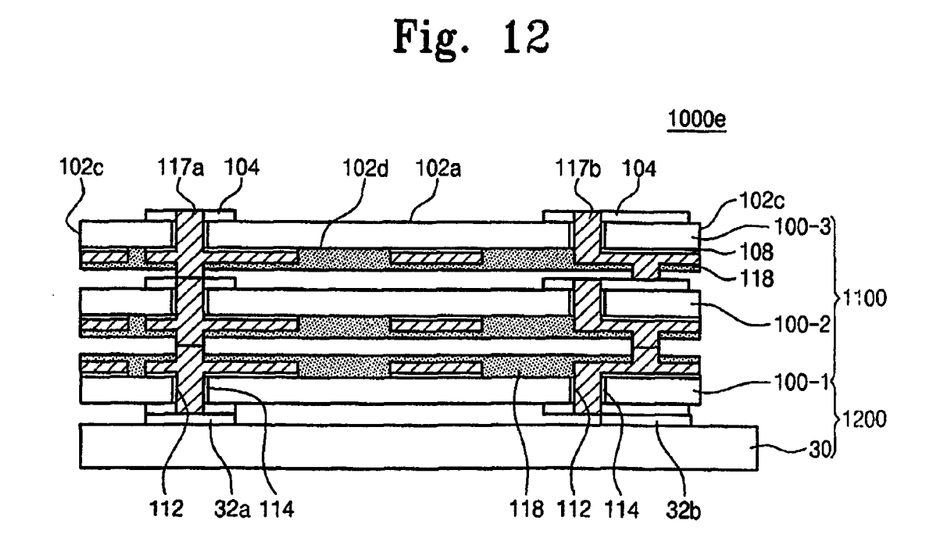
FIG. 12 illustrates a cross-sectional view of a 3-D device package according to a twelfth embodiment.

FIG. 12 illustrates a cross-sectional view of a 3-D device package 1000e according to a twelfth embodiment. Referring to FIG. 12, the device 1000e may include three chip packages 100, i.e., dies 100-1, 100-2 and 100-3, stacked on and attached to the next-level substrate 30. The upper two dies 100-3 and 100-2 may be attached to one another in a front-to-back orientation. The lower two dies 100-2 and 100-1 may be attached to one another in a back-to-back orientation.

Figure 13:
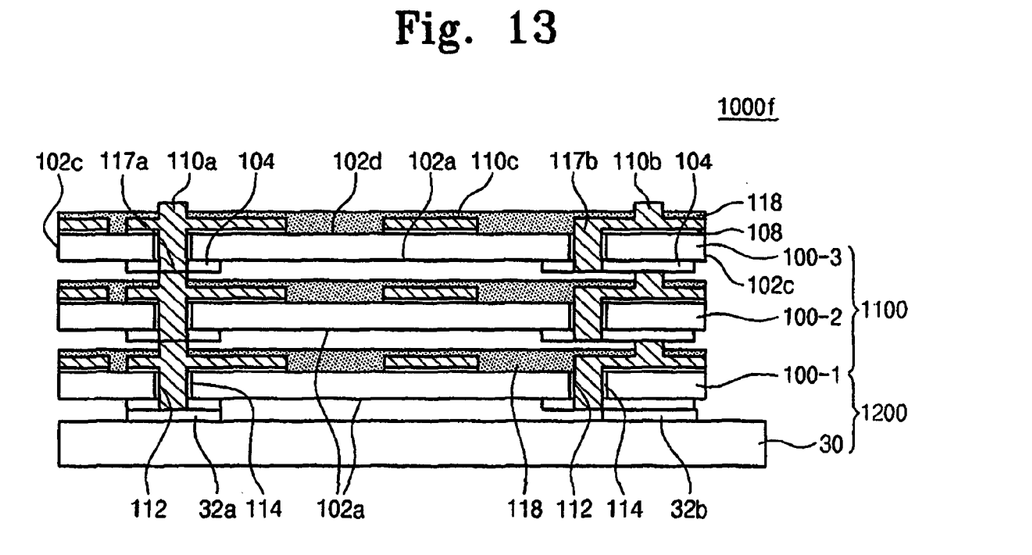
FIG. 13 illustrates a cross-sectional view of a 3-D device package according to a thirteenth embodiment.

FIG. 13 illustrates a cross-sectional view of a 3-D device package 1000f according to a thirteenth embodiment. Referring to FIG. 13, the device 1000f may include three chip package 100, i.e., dies 100-1, 100-2 and 100-3, each of which may be attached to an adjacent chip package 100 in a front-to-back orientation. All three dies may be inverted, such that the surfaces 102a thereof face the next-level substrate 30.

Figure 14:
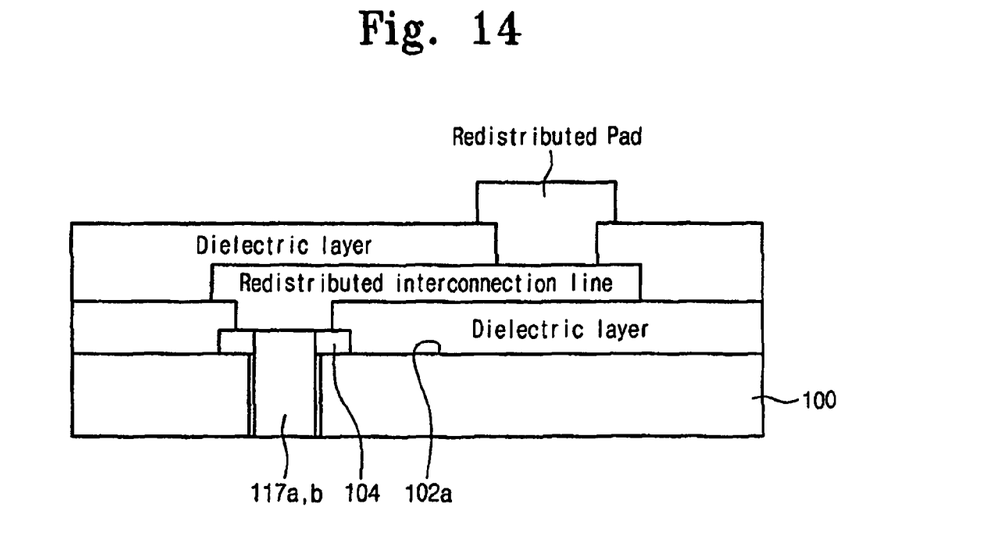
FIG. 14 illustrates a cross-sectional view of details of an example redistribution pattern according to a fourteenth embodiment.

FIG. 14 illustrates details of an example redistribution pattern according to a fourteenth embodiment. Referring to FIG. 14, the redistribution pattern may be disposed on the front side 102a, i.e., the active surface side, of the chip package 100. The through-hole electrode, e.g., 117a or 117b, may be electrically connected to the pad 104 as well as a redistributed interconnection line extending laterally across the front side 102a of the chip package 100. The redistributed interconnection line may be electrically insulated from the front side 102a of the chip package 100 by a lower dielectric layer and may be covered by an upper dielectric layer. An opening in the upper dielectric layer may expose a portion of the redistributed interconnection line, and a connection may be made between the exposed portion and a redistributed pad.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
   a semiconductor substrate having an active surface;
   a conductive member in a via extending through the substrate;
   a metal pattern bonded to a second surface of the substrate opposite the active surface and connected directly to the conductive member;
   an electrically insulating adhesive layer between the metal pattern and the second surface of the substrate, the adhesive layer bonding the metal pattern to the substrate;
   a second substrate attached to the second surface of the substrate in a stack, wherein the second substrate includes a plurality of conductive features bonded to corresponding features of the metal pattern; and a third substrate attached to the active surface of the semiconductor substrate, wherein:

the third substrate includes an active surface and a second surface opposite the active surface, a second metal pattern is bonded to the second surface of the third substrate, the third substrate being disposed between the second metal pattern and the substrate, and the active surface of the third substrate faces and is electrically connected to the active surface of the substrate.

2. The device as claimed in claim 1, wherein:

the second substrate is a printed circuit board, and the device further includes a second printed circuit board stacked on and electrically connected to the third substrate, such that the substrate and the third substrate are between the second substrate and the second printed circuit board.

* * * * *